US006717467B2

(12) United States Patent
Renous et al.

(10) Patent No.: US 6,717,467 B2
(45) Date of Patent: Apr. 6, 2004

(54) WIDEBAND DIFFERENTIAL AMPLIFIER COMPRISING A HIGH FREQUENCY GAIN-DROP COMPENSATOR DEVICE

(75) Inventors: Claude Renous, Grenoble (FR); François Van-Zanten, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 3 days.

(21) Appl. No.: 10/144,623

(22) Filed: May 13, 2002

(65) Prior Publication Data

US 2002/0167356 A1 Nov. 14, 2002

(30) Foreign Application Priority Data

May 14, 2001 (FR) .............................. 01 06298

(51) Int. Cl.[7] ................................................ H03F 3/45
(52) U.S. Cl. ...................... 330/253; 330/257; 330/292
(58) Field of Search ................................ 330/253, 257, 330/292

(56) References Cited

U.S. PATENT DOCUMENTS

| 4,529,948 A | 7/1985 | Bingham | 330/264 |
| 5,128,630 A | 7/1992 | Mijuskovic | 330/253 |
| 5,420,539 A | 5/1995 | Fensch | 330/253 |
| 5,541,555 A | * | 7/1996 | Pernici | 330/253 |
| 6,353,361 B1 | * | 3/2002 | Sun | 330/253 |

OTHER PUBLICATIONS

Dongen Van R et al. "A 1.5 V Class AB CMOS Buffer Amplifier for Driving Low–Resistance Loads" IEEE Journal of Solid–State Circuits, IEEE Inc. New York, US, vol. 30, No. 12, Dec. 1, 1995, pp. 1333–1337, XP000557237 ISSN: 0018–9200.

* cited by examiner

*Primary Examiner*—Khanh Van Nguyen
(74) *Attorney, Agent, or Firm*—Allen, Dyer, Doppelt, Milbrath & Gilchrist, P.A.; Lisa K. Jorgenson

(57) ABSTRACT

A wideband differential amplifier includes a first differential stage connected to a Miller stage allowing an open-loop gain increase. The Miller stage includes a current source and a resistive-capacitive network causing a feedback into the current source. The feedback includes a portion of a Miller stage output signal having a high frequency range to move a bias point of the current source within the high frequency range. Thus, a gain of the Miller stage significantly increases towards the bias point.

23 Claims, 4 Drawing Sheets

WIDEBAND DIFFERENTIAL AMPLIFIER COMPRISING A HIGH FREQUENCY GAIN-DROP COMPENSATOR DEVICE

FIELD OF THE INVENTION

The invention relates to semiconductor amplifier circuits and, more particularly, to a differential amplifier circuit having a device that compensates for high frequency gain-drop.

BACKGROUND OF THE INVENTION

Differential amplifiers are widely used in the telecommunications field. Indeed, they allow for the processing of signals that convey voice and, more generally, data. A differential structure is particularly preferred as it generally allows for elimination of harmonics and second-order non-linearities in distortion noise. Furthermore, it ensures greater immunity to common mode interference, such as the interference that power supply circuits of electronic circuits undergo.

This is why differential amplifiers are especially used in all data transfer networks of wire networks (Wide Area Network) as can be found in Asynchronous Transfer Mode (ATM) or Asynchronous Digital Subscriber Line (ADSL) type networks and their principal derivatives HDSL (commonly designated by the generic term XDSL).

With these types of networks, linearity of differential amplifiers has become a decisive factor, especially because the differential amplifiers are designed to operate within a large range of frequencies, for example, from 30 KHz to 10 MHz. Furthermore, in HDSL or VDSL type applications, data carrying signals have large amplitudes, within a voltage range, and consequently, amplifiers must be capable of processing these large signals with satisfactory linearity. For that purpose, it is essential that amplifier structures have a high open-loop gain in the whole considered frequency range, and not only in a narrow band portion. Thus, if a high gain is maintained, up to about 10 MHz for instance, a high feedback rate will be available up to about this extreme value and, consequently, a satisfactory linearity will be reached for the applications considered.

It is thus desirable to provide a low-cost and simple wideband differential amplifier structure which ensures high gain within the extreme values of the frequency band.

SUMMARY OF THE INVENTION

The object of the present invention is to provide a wideband differential amplifier structure, provided with a high frequency gain compensation device, which maintains open loop gain up to the highest value of the frequency band.

Another object of the invention is to provide a highly linear differential amplifier device which can be perfectly incorporated into an integrated circuit and uses, particularly, NMOS type components from the bi-CMOS technology.

Another object of the present invention is to provide a differential amplifier structure which is perfectly compatible with telecommunication network requirements and particularly with ADSL or HDSL type links.

The invention reaches these objects by a differential amplifier circuit for operating within a frequency band having first and second input terminals (E1, E2) and first and second output terminals (O1, O2). The circuit may comprise a first stage including first and second transistors of the same polarity and assembled to form a differential amplifier. The first and second transistors may be supplied by first and second mirror current sources, respectively, the current of which is controlled by a control circuit supporting a common mode voltage.

The circuit may further comprise a second Miller gain stage including third and fourth transistors of opposite type from the first and second transistors, and having inputs receiving output signals from the first stage, and supplied by a third and a fourth current source respectively. The third and fourth current sources may be controlled by a bias voltage ($V_{gs}$) into which a portion of output signals (O1, O2) are fed-back at high frequency, via a resistive-capacitive circuit, to significantly increase a gain of the second stage towards the upper end of the frequency band.

In a preferred embodiment, the first and second transistors are NMOS type transistors and the third and fourth transistors are PMOS type transistors, which are assembled as a common source. The drains of the PMOS transistors are connected to the first and second outputs O1 and O2, respectively, and have gates connected to receive the corresponding output signals from the first stage.

More particularly, the Miller gain stage current sources are frequency compensated and may comprise a first capacitor having a first terminal connected to the first output terminal (O1) and a second terminal, a second capacitor having a first terminal connected to the second output terminal (O2) and a second terminal, a first resistor having a first terminal connected to the second terminal of the second capacitor and a second resistor having a first terminal connected to the second terminal of the first capacitor. The first and second resistors may have a second common terminal connected to a fifth current source.

The circuit may further comprise a fifth transistor of NMOS type, for example, having a source, a drain and a gate, which are connected to ground, the second output terminal O2 and the first terminal of the second resistor, respectively. The gate of the fifth transistor may be connected to the second terminal of the first capacitor.

The circuit may further comprise a seventh transistor, for example of NMOS type. The seventh transistor may have a source connected to ground, and a drain and a gate connected to the second terminals of first and second resistors, respectively. The passive circuit including the first and second capacitors and the first and second resistors causes output signals to be fed back into gate voltages to maintain the stage's gain for high-frequency values. In a particular embodiment, the amplifier can be provided with a cascode or follower stage comprising, for instance, bipolar transistors.

The invention is especially adapted for use in wideband amplifiers used in wire telecommunications and, particularly, used in Asynchronous Digital Line Subscriber (ADSL) networks and derivatives thereof.

DETAILED DESCRIPTION OF THE PREFERRED EMBODIMENTS

Figure 1:
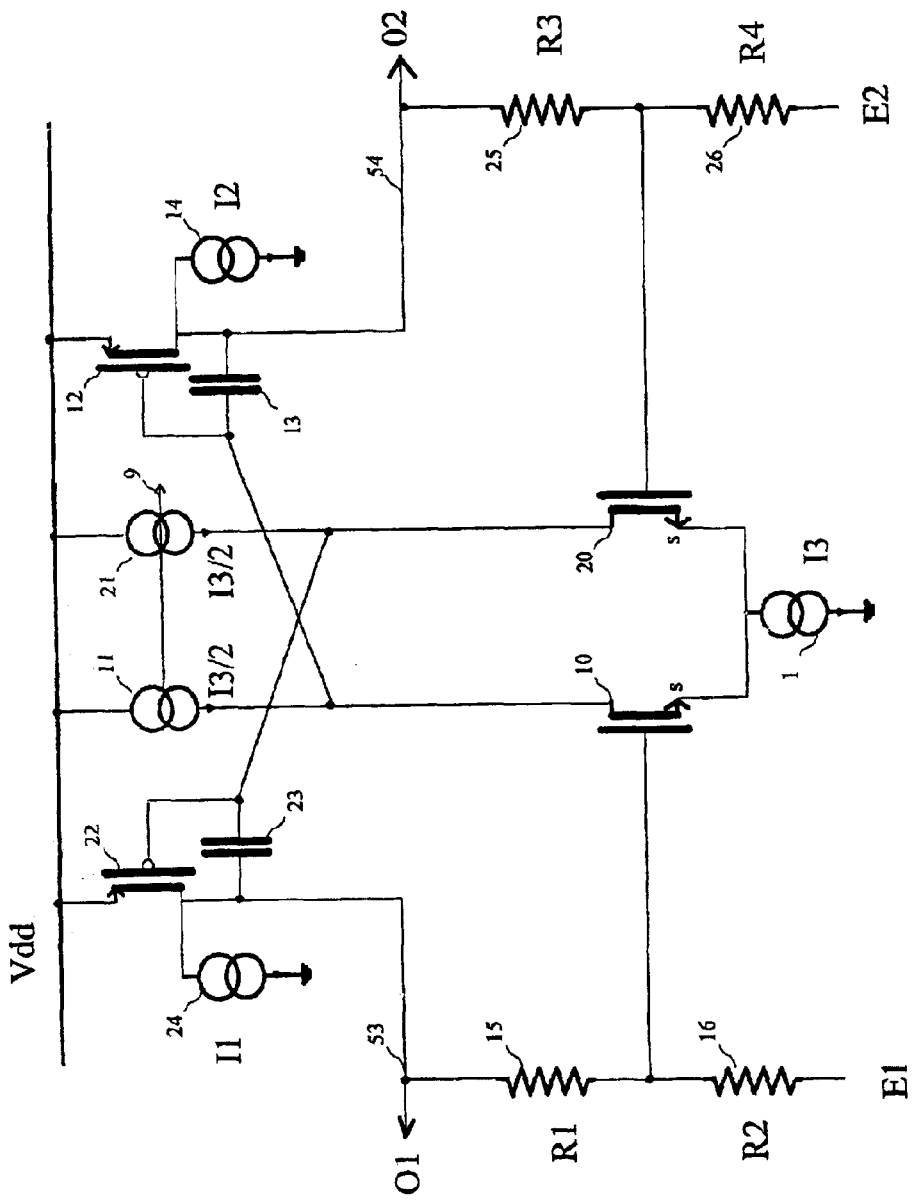
FIG. 1 illustrates an amplifier structure including a differential stage followed by a Miller gain stage according to the prior art.

FIG. 1 illustrates a conventional amplifier structure, which comprises a first transistor 10 and a second transistor 20, of NMOS type for example, together forming a differential pair. Although the preferred embodiment more particularly describes use of NMOS type transistors, it is clear that those skilled in the art will readily adapt the teachings of the present invention to an architecture comprising PMOS transistors.

The amplifier is supplied by a supply source supplying a voltage $V_{dd}$. Transistors 10 and 20 have a source terminal that is connected to a current source 1 (I3) in a common manner. The end of the current source is connected to a reference voltage, generally ground. Each transistor in the differential pair 10–20 is fed through its drain terminal by a respective current source 11–21, which are current mirroring sources controlled by a common mode supporting stage (not shown).

The differential pair formed by first and second transistors 10 and 20 acts as a first stage driving a second Miller type stage. This second stage comprises third and fourth transistors 12 and 22, of PMOS type for example, respectively, which are assembled with a common source. More precisely, the drain of the first transistor 10 is connected to the gate of the third transistor 12, and the source is connected to voltage supply terminal $V_{dd}$. Similarly, the drain of the second transistor 20 is connected to the gate of the fourth transistor 22, the source of which is connected to $V_{dd}$. The drain of the third transistor 12 is connected to a current source 14 connected to the ground at the other end. Similarly, the drain of the fourth transistor 22 is connected to a current source 24 which, in turn, is connected to the ground at the other end. The drain of the third transistor 12 is also connected to output O2 terminal 54 of the differential amplifier. Similarly, the drain of the fourth transistor 22 is also connected to output O1 terminal 53 of the differential amplifier.

The capacitors 13 and 23 complete the Miller structure. The capacitor 13 is connected between the drain and the source of the third transistor 12. Similarly, the capacitor 23 is connected between the drain and the source of the fourth transistor 22. The Miller stage is designed as class A operative, the current sources 14 and 24 will therefore be calibrated accordingly, to discharge all current in the amplifier load.

Associating the differential pair 10–20 and Miller gain stages 12–22 permits a particularly high open loop gain for the entire amplifier and further helps set its gain-band width product. Feedback resistors 15 (R1), 16 (R2), 25 (R3) and 26 (R4) set the open loop gain to the desired value which is R1/R2=R3/R4. More precisely, as is shown in FIG. 1, resistors 15 and 16 form a resistor bridge. The ends of the resistor bridge are connected to output terminal O1 and input terminal E1 of the differential amplifier, respectively, and the midpoint of which is connected to the gate of the transistor 10. Similarly, resistors 25 and 26 form a bridge, the ends of which are connected to output terminal O2 and input terminal E2, respectively, and the midpoint of which is connected to the gate of transistor 20. It is noted that, this known type of amplifier experiences a significant drop of open loop gain when the frequency moves to the highest value of the considered frequency band.

Figure 2:
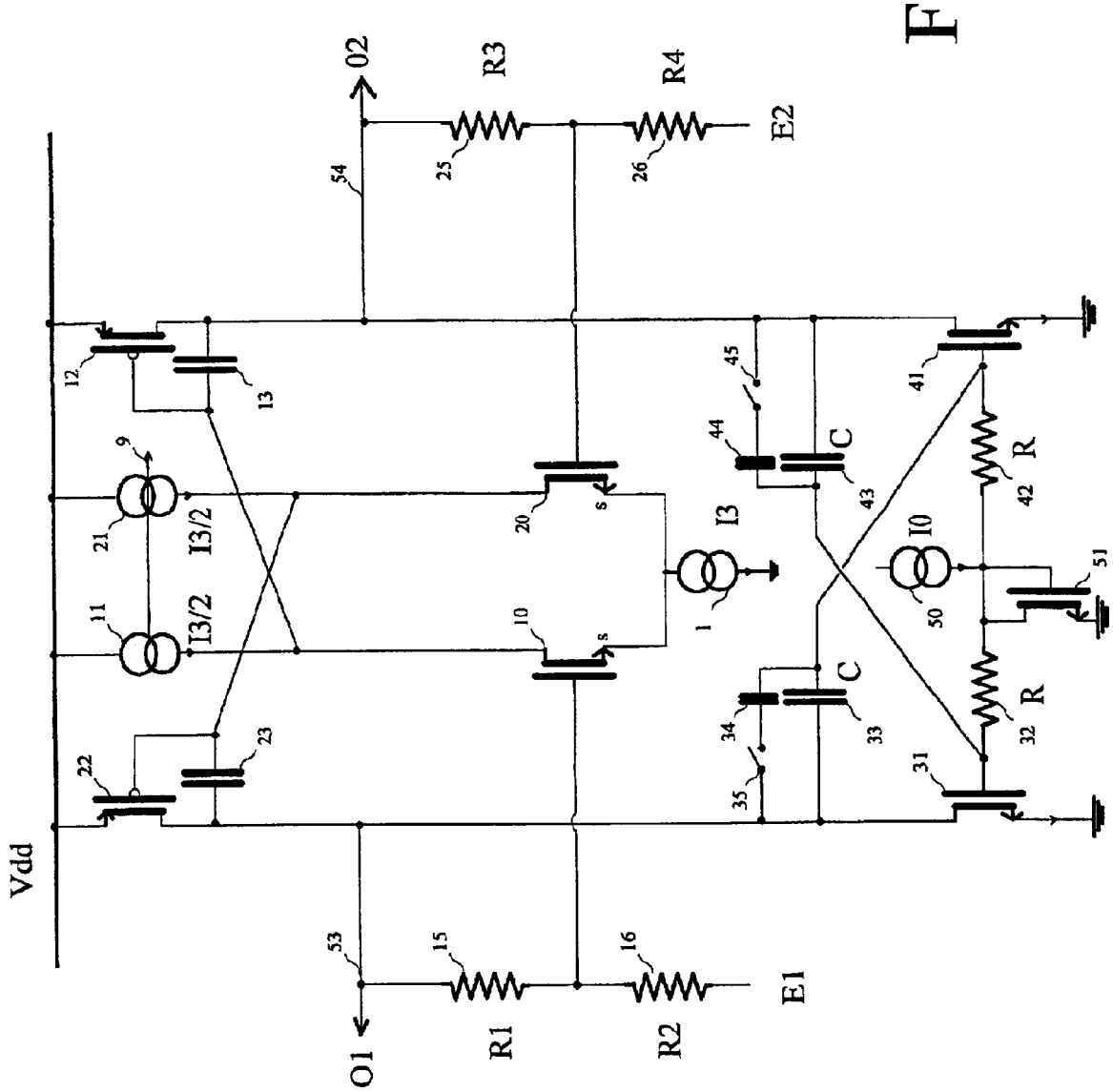
FIG. 2 illustrates an embodiment of the present invention wherein the Miller stage, shown in FIG. 1, is associated with a high-frequency compensated current source.

FIG. 2 shows how to greatly improve this situation by compensating for the open loop gain drop of the differential amplifier. To that purpose, a current source with a frequency compensation circuit that affects the higher portion of the frequency band of the differential amplifier is substituted for current sources 14 and 24.

More particularly, the frequency compensation circuit comprises fifth and sixth NMOS type transistors, respectively 31 and 41, which are assembled in mirror current relative to a seventh NMOS transistor 51. The sources of a fifth, sixth and seventh transistor 31, 41 and 51 are all connected to ground. The drain of the fifth transistor 31 is connected to output O1 terminal 53 and, similarly, a drain of the sixth transistor 41 is connected to the output O2 terminal 54. The drain and gate of the seventh transistor 51 are connected to a current I0 source 50 having another end connected to the supply voltage $V_{dd}$. The seventh transistor 51 drain and gate are also connected to resistor 32 and resistor 42. Each resistor has another terminal connected to the gates of transistor 31 and transistor 41, respectively. A capacitor 33 is connected between output O1 terminal 53 and the gate of the transistor 41. Another capacitor 43 is connected between output O2 terminal 54 and the gate of the transistor 31.

As is shown in FIG. 2, the fifth, sixth and seventh transistors 31, 41 and 51 are assembled as current mirroring transistors, which permit the third and fourth transistors 13 and 14 of the Miller stage to be supplied with power. Because of the two capacitors 33 and 43 being present, part of output signal O1 is fed back into the voltage at the gate of the transistor 41. Similarly, part of output signal O2 is fed back into the voltage at the gate of the transistor 51. This phenomenon causes the bias point of transistors 31 and 41 to change and, consequently, causes additional current flow in the Miller stage sources and a corresponding increase of the gain of the Miller stage. If values of resistor 32–42 and capacitors 33–43 are judiciously set to obtain a cut-off frequency that ranges in the upper portion of desired frequency band, then as a result, the amplifier's natural open-loop gain loss will be compensated when the amplifier operates within the upper end of the frequency band. Thus, the compensation circuit compensates the gain drop usually observed within the highest frequencies.

It is apparent that the positioning of the cut-off frequency of passive resistive-capacitive circuits 32–33 and 42–43 is particularly decisive. Fine adjustment of the RC product of resistance values and capacitance values will be needed. In a particular embodiment, the amplifier is provided with an RC-tuning device that precisely measures the value of the RC product of resistors 32–42 and capacitors 33–43 during an initialization step at startup. For that purpose, additional capacitors, for example capacitors 34 and 44 in FIG. 2, can be connected in parallel to capacitors 33 and 43 by electric switches 35 and 45, respectively.

A control circuit (not shown) comprises an accurate current source for supplying an oscillator circuit formed by resistors 32–42 and capacitors 33–43. This control circuit also comprises means or circuitry for measuring the oscillation frequency of the oscillator circuit formed by these resistors and capacitors. According to the measured value, the control circuit determines which control signals to apply to switches 35 and 45 during the operative step, following the initialization step, to ensure fine adjustment of the gain compensation provided by transistors 31 and 41 during this operative step.

The above described compensation circuit adapts to all known types of differential structures. Such flexibility will be illustrated with two particular embodiments: a first embodiment comprising a common mode supporting stage, and another embodiment comprising a cascode circuit.

Figure 3:
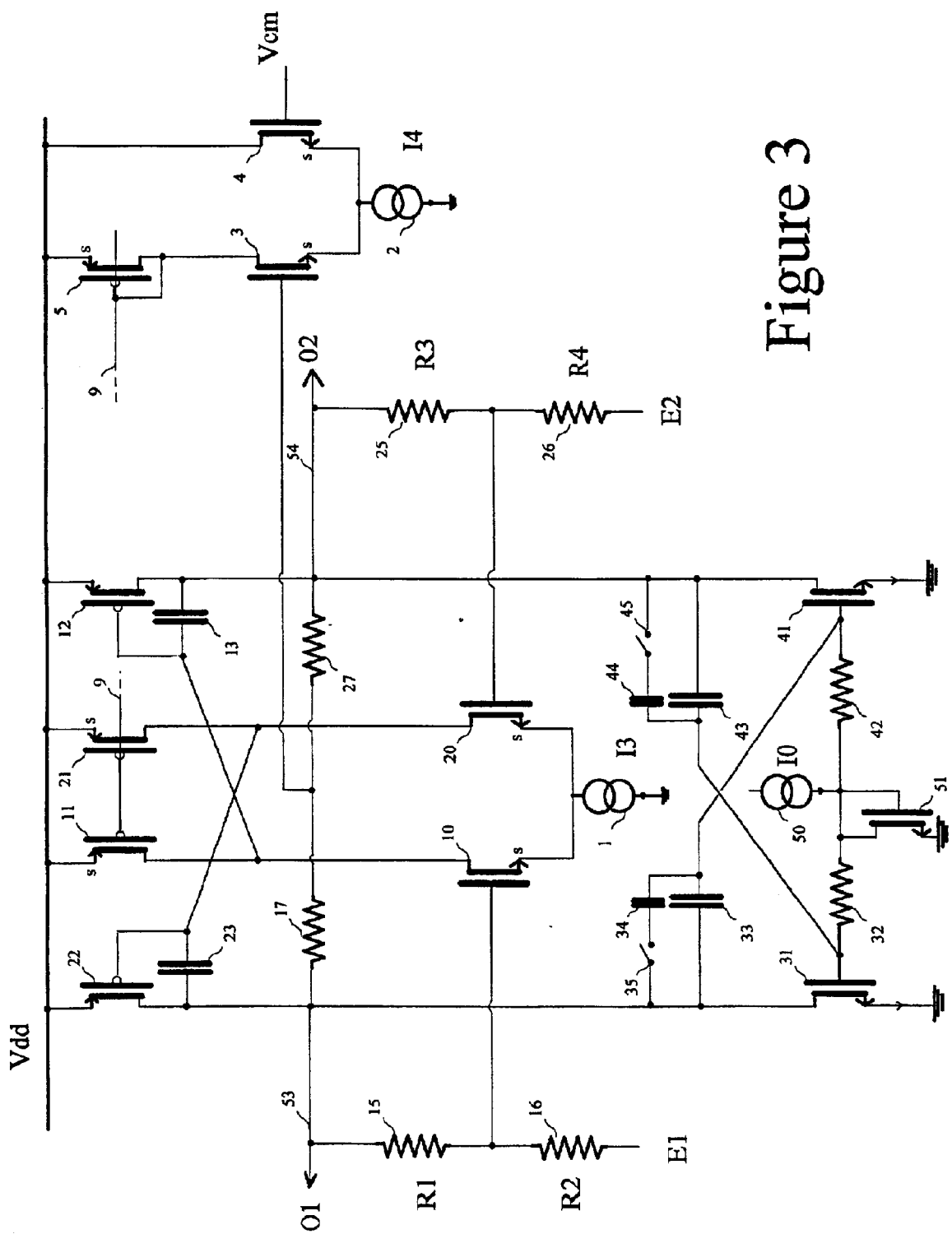
FIG. 3 illustrates a particular embodiment of a complete differential amplifier circuit including a common mode supporting stage according to the present invention.

FIG. 3 shows an amplifier circuit comprising the compensation system of FIG. 2 and further comprising a common mode supporting stage. In this structure, current sources 11 and 12 are realized by PMOS type transistors controlled by a common mode supporting stage which comprises a second differential pair associated with a current (I4) source 2 and a PMOS type transistor 5. More particularly, the second differential pair comprises two transistors 3 and 4 having sources connected to a current (I4) source 2 and having another end connected to ground. The drains of transistors 3 and 4 are connected to the drain of transistor 5 and the supply terminal $V_{dd}$, respectively.

The gate of transistor 3 is connected to a resistive bridge midpoint, comprising two resistors 17 and 27 generally of equal values. The ends of the resistors 17 and 27 are connected to output terminals O1 and O2 of the differential amplifier, respectively. The resistive bridge 17–27 is used to obtain, at its midpoint, a potential representative of the common mode value of the differential amplifier outputs O1 and O2. The gate of the transistor 4 receives a reference voltage, $V_{CM}$, which is used to set the common mode stage bias level and which is generally set to $V_{dd}/2$ to obtain an output signal maximum dispersion at terminals O1 and O2.

Gate terminals of transistors 5, 11 and 12 are all connected together and the gate of transistor 5 connected to its drain, thus ensuring it operates within the square zone of its characteristic $I(V_{GS})$. Thus, the transistors are mounted in current mirror and a same drain current flows through them since, as they are substantially identical, they undergo the same variations of gate-source voltage $V_{GS}$.

As can be seen in FIG. 3, the common mode supporting circuit sets the common mode voltages with respect to the reference voltage, $V_{CM}=V_{dd}/2$. Indeed, it can be seen that, should the potential of one of the outputs increase for any reason, for instance a circuit temperature rise, this increase would affect the resistive bridge 17–27 midpoint and cause a corresponding voltage increase at the gate of transistor 3. A current would then flow through transistor 3 because the gate voltage of the additional transistor 4 would still be set to the unchanged value of the reference voltage $V_{CM}$. The currents in transistors 11 and 21 would then be modified thus causing the output voltage to go back to the reference value.

Figure 4:
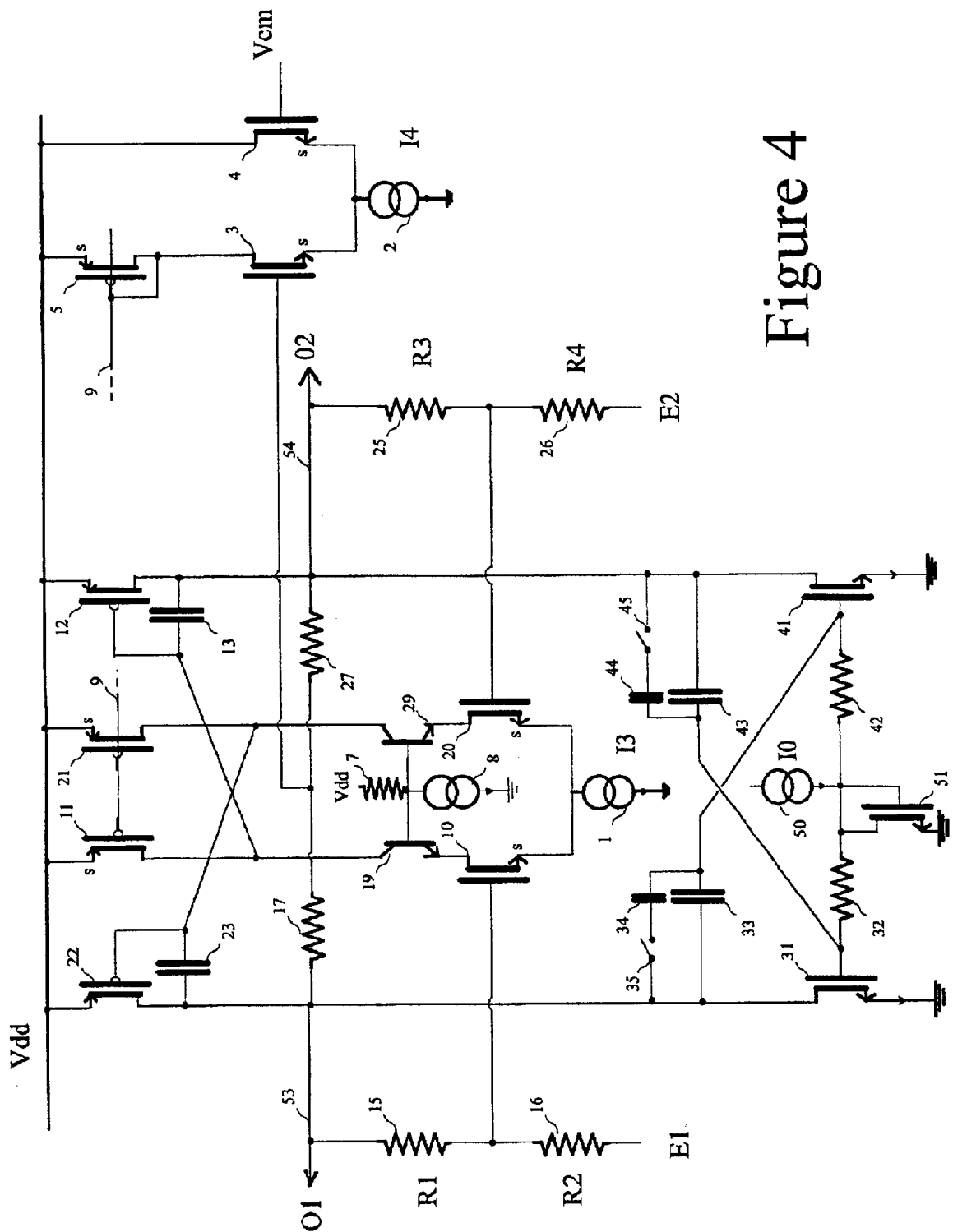
FIG. 4 illustrates another embodiment of the differential amplifier circuit, shown in FIG. 3, including a cascode circuit connected between the differential stage and the Miller gain stage.

In another embodiment as illustrated in FIG. 4, the amplifier may further comprise an impedance adapter cascode circuit between differential pair 10–20 and the Miller gain stage. In this embodiment, the drain of transistor 10 is not connected directly to the drain of transistor 11, but an NPN type bipolar transistor is interposed between transistors 10 and 11. More precisely, an emitter and a collector of transistor 19 are connected to the transistor 10 drain and the transistor 11 drain, respectively. Similarly, a NPN type bipolar transistor 29 is interposed between transistor 20 and transistor 21. More precisely, an emitter and a collector of transistor 29 are connected to the drain of transistor 20 and the drain of transistor 21, respectively. The bases of both bipolar transistors 19 and 29 are connected to a resistor 7 connected to the supply voltage $V_{dd}$ and to a current source 8. An opposite end of the resistor is connected to ground.

As will be apparent to people qualified in the art, the advantage of the cascode circuit is to provide large impedance at the first stage comprising the transistor pair 10–20 to further increase the open loop gain of the amplifier.

The above described compensation circuit may thus be integrated into any type of amplifier circuit and it is perfectly adapted to bi-CMOS technology. Furthermore, any person qualified in the art may very easily adapt the structure in FIG. 3 to a cascode circuit comprising NMOS type transistors instead of bipolar transistors.

That which is claimed is:

1. A differential amplifier circuit for operating within a frequency band and having first and second input terminals and first and second output terminals, the differential amplifier circuit comprising:
   a first stage comprising
      first and second transistors,
      first and second mirror current sources for feeding said first and second transistors, respectively, and
      a control circuit for controlling said first and second mirror current sources; and a second stage comprising
      third and fourth transistors for receiving output signals from said first stage,
      third and fourth current sources for feeding said third and fourth transistors, respectively, and
      a resistive-capacitive circuit for feeding back a portion of the output signals for controlling said third and fourth current sources such that bias points thereof are moved to increase a gain of said second stage towards an upper end of the frequency band.

2. A differential amplifier circuit according to claim 1, wherein said control circuit supports a common mode operation.

3. A differential amplifier circuit according to claim 1, wherein said first and second transistors comprise NMOS transistors and said third and fourth transistors comprise PMOS transistors having drains connected to the first and second output terminals, respectively, and gates receiving corresponding output signals from said first stage.

4. A differential amplifier circuit according to claim 1, wherein said third and fourth current sources comprise:
   a first capacitor having a first terminal connected to the first output terminal and having a second terminal;
   a second capacitor having a first terminal connected to the second output terminal and having a second terminal;
   a first resistor having a first terminal connected to the second terminal of said second capacitor and having a second terminal;
   a second resistor having a first terminal connected to the second terminal of said first capacitor and having a second terminal;
   a fifth current source connected to the second terminals of said first and second resistors;
   a fifth transistor having a source connected to a voltage reference, a drain connected to the first output terminal and a gate connected to the first terminal of said first resistor and the second terminal of said second capacitor;
   a sixth transistor having a source connected to the voltage reference, a drain connected to the second output and a gate connected to the first terminal of said second resistor and to the second terminal of said first capacitor; and
   a seventh transistor having a source connected to the voltage reference, a drain connected to the second terminal of said first resistor, and a gate connected to the second terminal of said second resistor;
   whereby said resistive-capacitive circuit feeds back a portion of the output signals to maintain the gain of said second stage.

5. A differential amplifier circuit according to claim 2, further comprising:
   first and second electrical switches; and
   third and fourth capacitors connected in parallel to said first and second capacitors via said first and second electrical switches, respectively.

6. A differential amplifier circuit according to claim 4, further comprising a cascode stage connected between said first stage and said second stage.

7. A differential amplifier circuit according to claim 6, wherein said cascode stage comprises a pair of NPN bipolar transistors having their respective bases connected together.

8. A differential amplifier circuit according to claim 6, wherein said cascode stage comprises a pair of NMOS transistors having their respective gates connected together.

9. A differential amplifier circuit for operating within a frequency band and having first and second input terminals and first and second output terminals, the differential amplifier circuit comprising:
   a first stage comprising
      first and second transistors,
      first and second mirror current sources for feeding said first and second transistors, respectively, and
      a control circuit for controlling said first and second mirror current sources; a second stage comprising
      third and fourth transistors for receiving output signals from said first stage,
      third and fourth current sources for feeding said third and fourth transistors, respectively, and
      a resistive-capacitive circuit for feeding back a portion of the output signals for controlling said third and fourth current sources such that bias points thereof are moved to increase a gain of said second stage towards an upper end of the frequency band; and
   a cascode stage connected between said first stage and said second stage.

10. A differential amplifier circuit according to claim 9, wherein said control circuit supports a common mode operation.

11. A differential amplifier circuit according to claim 9, wherein said first and second transistors comprise NMOS transistors and said third and fourth transistors comprise PMOS transistors having drains connected to the first and second output terminals, respectively, and gates receiving corresponding output signals from said first stage.

12. A differential amplifier circuit according to claim 9, wherein said third and fourth current sources comprise:
   a first capacitor having a first terminal connected to the first output terminal and having a second terminal;
   a second capacitor having a first terminal connected to the second output terminal and having a second terminal;
   a first resistor having a first terminal connected to the second terminal of said second capacitor and having a second terminal;
   a second resistor having a first terminal connected to the second terminal of said first capacitor and having a second terminal;
   a fifth current source connected to the second terminals of said first and second resistors;
   a fifth transistor having a source connected to a voltage reference, a drain connected to the first output terminal and a gate connected to the first terminal of said first resistor and the second terminal of said second capacitor;
   a sixth transistor having a source connected to the voltage reference, a drain connected to the second output and a gate connected to the first terminal of said second resistor and to the second terminal of said first capacitor; and
   a seventh transistor having a source connected to the voltage reference, a drain connected to the second terminal of said first resistor, and a gate connected to the second terminal of said second resistor;
   whereby said resistive-capacitive circuit feeds back a portion of the output signals to maintain the gain of said second stage.

13. A differential amplifier circuit according to claim 9, further comprising:
   first and second electrical switches; and
   third and fourth capacitors connected in parallel to said first and second capacitors via said first and second electrical switches, respectively.

14. A differential amplifier circuit according to claim 9, wherein said cascode stage comprises a pair of NPN bipolar transistors having their respective bases connected together.

15. A differential amplifier circuit according to claim 9, wherein said cascode stage further comprises a pair of NMOS transistors having their respective gates connected together.

16. An ATM-type or XDSL-type data communicating device comprising:
   a differential amplifier circuit and operating within a frequency band and having first and second input terminals and first and second output terminals, said differential amplifier circuit comprising:
   a first stage comprising
      first and second transistors,
      first and second mirror current sources for feeding said first and second transistors, respectively, and
      a control circuit for controlling said first and second mirror current sources; and a second stage comprising
      third and fourth transistors for receiving output signals from said first stage,
      third and fourth current sources for feeding said third and fourth transistors, respectively, and
      a resistive-capacitive circuit for feeding back a portion of the output signals for controlling said third and fourth current sources such that bias points thereof are moved to increase a gain of said second stage towards an upper end of the frequency band.

17. An ATM-type or XDSL-type data communicating device according to claim 16, wherein said control circuit supports a common mode operation.

18. An ATM-type or XDSL-type data communicating device according to claim 16, wherein said first and second transistors comprise NMOS transistors and said third and fourth transistors comprise PMOS transistors having drains connected to the first and second output terminals, respectively, and gates receiving corresponding output signals from said first stage.

19. An ATM-type or XDSL-type data communicating device according to claim 16, wherein said third and fourth current sources comprise:
   a first capacitor having a first terminal connected to the first output terminal and having a second terminal;
   a second capacitor having a first terminal connected to the second output terminal and having a second terminal;
   a first resistor having a first terminal connected to the second terminal of said second capacitor and having a second terminal;
   a second resistor having a first terminal connected to the second terminal of said first capacitor and having a second terminal;

a fifth current source connected to the second terminals of said first and second resistors;

a fifth transistor having a source connected to a voltage reference, a drain connected to the first output terminal and a gate connected to the first terminal of said first resistor and the second terminal of said second capacitor;

a sixth transistor having a source connected to the voltage reference, a drain connected to the second output and a gate connected to the first terminal of said second resistor and to the second terminal of said first capacitor; and a seventh transistor having a source connected to the voltage reference, a drain connected to the second terminal of said first resistor, and a gate connected to the second terminal of said second resistor;

whereby said resistive-capacitive circuit feeds back a portion of the output signals to maintain the gain of said second stage.

20. An ATM-type or XDSL-type data communicating device according to claim 19, further comprising:

first and second electrical switches; and third and fourth capacitors connected in parallel to said first and second capacitors via said first and second electrical switches, respectively.

21. An ATM-type or XDSL-type data communicating device according to claim 19, further comprising a cascode stage connected between said first stage and said second stage.

22. An ATM-type or XDSL-type data-communicating device according to claim 21, wherein said cascode stage comprises a pair of NPN bipolar transistors having their respective bases connected together.

23. An ATM-type or XDSL-type data communicating device according to claim 21, wherein said cascode stage comprises a pair of NMOS transistors having their respective gates connected together.

* * * * *